(12) United States Patent
Matsumoto

(10) Patent No.: US 7,102,293 B2
(45) Date of Patent: Sep. 5, 2006

(54) ORGANIC EL PANEL

(75) Inventor: Shoichiro Matsumoto, Gifu (JP)

(73) Assignee: Sanyo Electric Co., Ltd., (JP)

( * ) Notice: Subject to any disclaimer, the term of this patent is extended or adjusted under 35 U.S.C. 154(b) by 0 days.

(21) Appl. No.: 10/950,915

(22) Filed: Sep. 27, 2004

(65) Prior Publication Data

US 2005/0073264 A1    Apr. 7, 2005

(30) Foreign Application Priority Data

Sep. 29, 2003    (JP)    ............... 2003-337933

(51) Int. Cl.
*G09G 3/10*    (2006.01)
(52) U.S. Cl. ................. 315/169.3; 315/169.1
(58) Field of Classification Search ............ 315/169.1, 315/169.3; 345/76, 77
See application file for complete search history.

(56) References Cited

U.S. PATENT DOCUMENTS

| | | | |
|---|---|---|---|
| 5,684,365 A | 11/1997 | Tang et al. | |
| 6,028,580 A | 2/2000 | Kosegawa et al. ............ 345/98 |
| 6,040,813 A | 3/2000 | Takubo ....................... 345/92 |
| 6,268,631 B1 | 7/2001 | Fukada et al. | |
| 6,307,322 B1 | 10/2001 | Dawson et al. ......... 315/169.1 |
| 6,362,798 B1 | 3/2002 | Kimura et al. ............... 345/55 |
| 6,366,025 B1 | 4/2002 | Yamada ................. 315/169.3 |
| 6,456,013 B1 | 9/2002 | Komiya et al. ......... 315/169.1 |
| 6,469,318 B1 | 10/2002 | Yamada et al. ............... 257/59 |
| 6,522,079 B1 | 2/2003 | Yamada ................. 315/169.3 |
| 6,522,315 B1 | 2/2003 | Ozawa et al. ................ 345/92 |
| 6,545,424 B1 | 4/2003 | Ozawa ................... 315/169.3 |
| 6,570,584 B1 | 5/2003 | Cok et al. ................... 345/690 |
| 6,690,110 B1 | 2/2004 | Yamada et al. ............. 313/506 |
| 6,690,117 B1 | 2/2004 | Komiya ................... 315/169.3 |
| 6,750,833 B1 | 6/2004 | Kasai .......................... 345/76 |
| 6,771,028 B1* | 8/2004 | Winters ................... 315/169.1 |
| 6,784,454 B1 | 8/2004 | Anzai .......................... 257/59 |
| 6,798,405 B1* | 9/2004 | Anzai ......................... 345/205 |
| 6,847,343 B1 | 1/2005 | Anzai .......................... 345/90 |
| 6,903,731 B1* | 6/2005 | Inukai ......................... 345/204 |
| 6,919,681 B1* | 7/2005 | Cok et al. ................... 313/500 |
| 2002/0101394 A1* | 8/2002 | Anzai .......................... 345/76 |
| 2003/0067458 A1* | 4/2003 | Anzai ......................... 345/204 |
| 2003/0076046 A1 | 4/2003 | Komiya et al. .......... 315/169.3 |
| 2003/0197666 A1* | 10/2003 | Akimoto et al. .............. 345/82 |
| 2004/0080470 A1* | 4/2004 | Yamazaki et al. ............ 345/76 |
| 2004/0217928 A1* | 11/2004 | Yamazaki et al. ............ 345/81 |

FOREIGN PATENT DOCUMENTS

| | | |
|---|---|---|
| JP | 2001-109405 | 4/2001 |
| JP | 2001-290441 | 10/2001 |

OTHER PUBLICATIONS

Office Action dated Feb. 28, 2006 for related U.S. Appl. No. 10/950,729.
Office Action dated Jun. 19, 2006 for related application, S.N. 10/980,729 (Our Ref. YKI-0161).

* cited by examiner

*Primary Examiner*—Wilson Lee
*Assistant Examiner*—Tung Le
(74) *Attorney, Agent, or Firm*—Cantor Colburn LLP

(57) ABSTRACT

A drive transistor is connected, via its drain region, to a power supply line, and, via its source region, to a transparent electrode of an organic EL element. The channel region is formed bent into a substantially L shape. This arrangement is able to simplify the arrangement of a gate electrode by providing the gate electrode so as to run straight over a channel region in parallel to the power source line. Accordingly, the aperture ratio is increased.

10 Claims, 3 Drawing Sheets

ORGANIC EL PANEL

CROSS-REFERENCE TO RELATED APPLICATIONS

The entire disclosure of Japanese Patent Application No. 2003-337933 including specification, claims, drawings and abstract is incorporated herein by reference.

BACKGROUND OF THE INVENTION

1. Field of the Invention

The present invention relates to an organic electroluminescence panel where organic EL elements, each having at least an organic light emitting layer between a pair of electrodes, are arranged in matrix.

2. Description of the Related Art

Organic electroluminescence (hereinafter referred to as EL) panels have been receiving attention as one of the next generation flat displays to take place the liquid crystal displays. In the display panels (hereinafter referred to as an organic EL panel), the color of light emitted by each pixel can be determined depending on the kind of light emitting material used to form an organic light emitting layer for the pixel. Thus, pixels for different color light are formed so that RGB display can be realized.

In this organic EL panel, bright display is achieved by increasing the amount of current supplied to each organic EL element. However, increase of a current amount results in reduction of the service life of an organic EL element. Therefore, instead of increasing a current amount, it is desired to ensure the largest possible area for a light emitting region, or an aperture ratio, in each pixel.

A larger aperture ratio enables brighter display while suppressing current supplied to the organic EL element to a relatively small amount (See Japanese Patent Laid-open Publication No. 2001-290441). Increase of an aperture ratio means increase of the proportion of the light emitting region of an organic EL element relative to the entire area of each pixel.

Here, in an organic EL panel of an active type, at least two TFTs are provided in each pixel to drive the concerned organic EL element. Specifically, a driver TFT for controlling a driving current supplied to the organic EL element is arranged between the power supply line and the organic EL element in the circuit structure. That is, the driver TFT is positioned close to the power supply line and the organic EL element in a two-dimensional arrangement. Moreover, the driver TFT, which controls a driving current to be supplied to the organic EL element according to a gate voltage, has a long gate length. With these factors, appropriate positioning of the driver TFT is difficult to achieve.

Further, the gate line of a driver TFT must be placed detouring around the contacts of the source and drain electrodes located at both ends of the driver TFT. Wiring in this manner results in a problem of reduction of an aperture ratio.

SUMMARY OF THE INVENTION

According to the present invention, a drive transistor has a substantially L-shaped (L or invert L) semiconductor layer. This can increase freedom in arranging elements of a drive transistor. In particular, a gate electrode can be formed straight. That is, wiring pattern for the gate electrode can be simplified, and the aperture ratio can be increased.

BRIEF DESCRIPTION OF THE DRAWINGS

A preferred embodiment of the present invention will be described in detail based on the following figures, wherein.

DESCRIPTION OF THE PREFERRED EMBODIMENTS

In the following, an embodiment of the present invention will be described with reference to the accompanied drawings.

Figure 1:
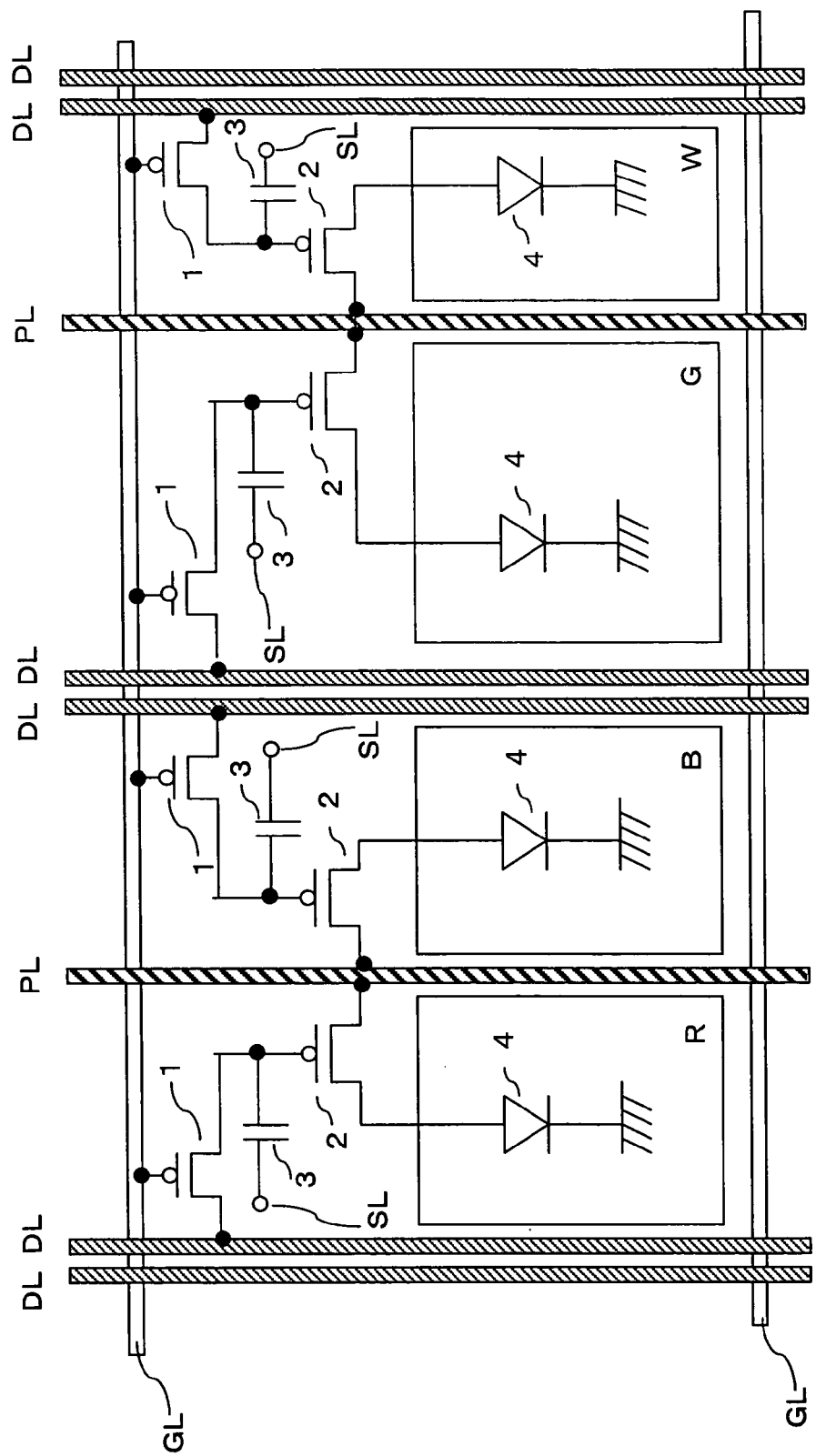
FIG. 1 is a diagram schematically showing a plane structure of an embodiment of the present invention.

FIG. 1 schematically shows a structure of an embodiment of the present invention. A single data line DL is provided for each pixel column and mounted such that two data lines DL are placed between pixel columns for every other pixel column. A power supply line PL is placed in a space between pixel columns, where a data line DL is not mounted. A gate line GL is mounted between pixel rows.

In each pixel, a selection TFT 1, a driver TFT 2, a holding capacitor 3, and an organic EL element 4 are provided. In this example, the selection TFT 1 is a p-channel TFT, and connected, via its source, to a data line DL, via its drain, to the gate of the driver TFF 2, and via its gate, to a gate line GL.

The driver TFT 2 is also a p-channel TFT, and connected, via its source, to a power supply line PL, and via its drain, to the node of the organic EL element4. The cathode of the organic EL element 4 is grounded. The gate of the driver TFT 2 is connected to one end of the holding capacitor 3, the other end of which is connected to the holding capacitor line SL.

With this structure, by setting the gate line GL at a low level (L), the selection TFTs 1 in the relevant pixel row are turned on. Then, when pixel data for the respective pixel columns are supplied to the data lines DL for the respective pixel columns while the selection TFTs are in an ON state as described above, the gates of the respective driver TFTs 2 of the respective pixels are set at the voltage of the pixel data, and the voltage is held in the respective holding capacitors 3.

Thereafter, appropriate current according to the supplied pixel data is supplied from the power supply lines PL via the driving TFTs 2 to the respective organic EL elements 4 of the respective pixels, so that light emission according to the pixel data is achieved.

In this embodiment, each pixel emits light of either red (R), green (G), blue (B), or white (W), and the pixels for the same color light are arranged in the same column, that is, a stripe arrangement. As a result, pixels for R, B, G, and W light are arranged in the row direction. In this example, pixels for R and B light have a substantially identical width, while pixels for G light have the largest width and pixels for W light have the smallest width.

A power supply line PL is provided running either between R and B pixel columns or between G and W pixel columns. That is, a single power supply line PL is shared by either R and B pixel columns or by G and W pixel columns.

The size of each pixel is determined based on the current efficiency of the relevant organic EL element 4. "Current efficiency", rephrased as an external quantum efficiency, refers to the amount of light emitted for a unit current, and, in this embodiment, corresponds to the maximum current amount used for display. Larger necessary maximum current means poorer current efficiency. The current efficiency depends on the kind of organic light emitting material, and so forth, used to form an organic EL element 4.

In this example, an organic EL element 4 for W light has the highest current efficiency, while an organic EL element 4 for G light has the lowest current efficiency. For color balancing in full-color display, an organic EL element 4 for a color with low current efficiency requires a current of a larger amount.

Here, as the service life of an organic EL element 4 is governed by the relevant current density, a constant current density is desired to be maintained with the respective organic EL elements 4. For this reason, an organic EL element 4 for a color with poor current efficiency is designed to have a larger area so that a constant current density can be maintained with the respective organic EL elements 4.

A pixel column for W light with the best current efficiency and a pixel column for G light with the poorest current efficiency share a single power supply line PL, while pixel columns for R and B light with intermediate current efficiency share another power supply line PL. With this arrangement, substantially close amounts of current flow in the respective power supply lines PL.

Here, the line width is determined based on the maximum current amount and a very wide line cannot be employed due to the upper limit of the line width. By balancing the current amounts as in this embodiment, it is possible to cause close amounts of current to flow in the power supply lines PL running between the pixel columns for R and B light and between pixel columns for G and W light, respectively, so that effective current supply can be achieved.

Here, a conventional structure requires one power supply line PL and one data line DL for each pixel column, and these two lines are arranged in a space between pixel columns. In general, according to a design rule, a space of about 4 μm must be ensured between two parallel running wirings.

In the case where two power supply lines PL, each having the width of about 10 μm, for example, are arranged between pixel columns, the total line width of these two lines is generally 24 μm. In this embodiment, however, where one, instead of two, power supply lines PL are used, it is known that the entire line width is as small as about 15 μm.

This is because, as the 10 μm width of each line includes an indispensable margin for one line, when two lines are combined into one line, the margin for one line becomes redundant, that is, omissible. In addition, as the space, which is 4 μm here, between two lines is also omissible, the total width of 9 μm can be eliminated, as compared to a case where two separate lines are used. Consequently, only a smaller area is necessary for installation of the wiring, and accordingly a larger aperture ratio can be ensured.

It should be noted that the superiority order of current efficiency among colors W, R, B, and G is not limited to the one described in this embodiment, that is, W, R, B, and G, but may vary depending on the light emitting material used for the respective colors.

For three color light emission for R, G, and B, pixels for R light with the best light emitting efficiency may use a dedicated power supply line, while pixels for G and B light with lower efficient light emitting efficiency may share another power supply line.

Figure 2:
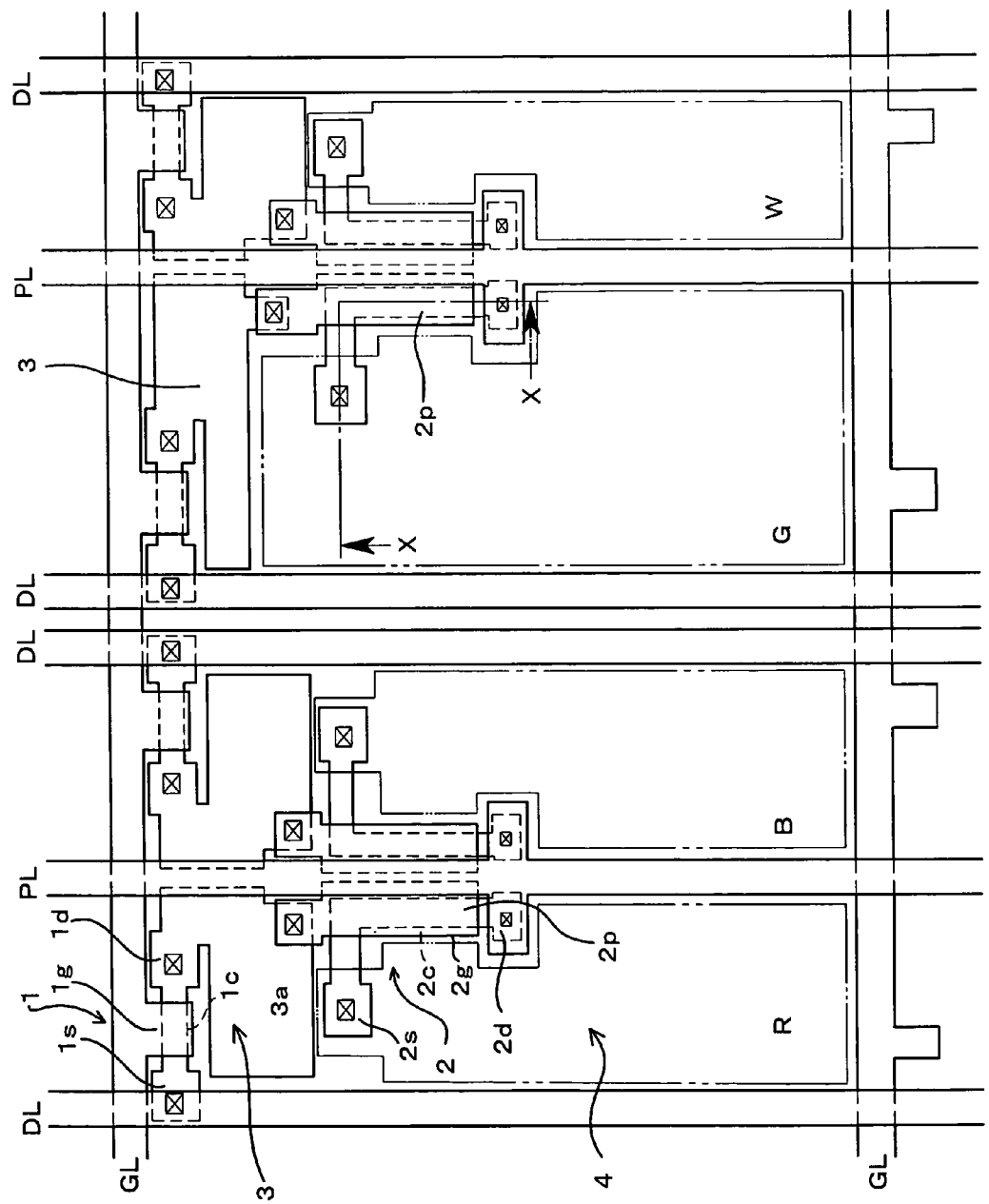
FIG. 2 is a diagram showing a plane structure of the embodiment.

FIG. 2 shows a specific arrangement of pixels. A selection TFT 1 includes a semiconductor layer. A part of a gate line GL project over a channel region 1c of the selection TFT 1 to constitute a gate electrode 1g. A source is of the selection TFT 1 is connected to a data line DL which is located above the selection TFT 1, via a contact.

The semiconductor layers for the source is extend so as to constitute a capacitor electrode 3a, which, together with a holding capacitor line (not shown) arranged opposed to the capacitor electrode 3a, constitute a holding capacitor 3.

The capacitor electrode 3a is connected, via a contact, to a gate electrode 2g of a driver TFT 2. The gate electrode 2g runs straight in parallel to (and along with) the power supply line PL. It should be noted that the gate electrode 2g is located partly below the power supply line PL.

The semiconductor layer for the driving TFT 2 (portions 2s, 2c, 2d, all together referred to by reference numeral 2p, described later) extends upward (in the drawing) from a contact formed on a portion of the power supply line PL, which projects into the pixel region, until it bends at a right angle such that the driving TFT 2 is formed in an L or invert-L shape. The other end of the driver TFT 2 is connected via a contact to the anode of the organic EL element 4, which is located above the driver TFT 2.

In this example, the driver TFT 2 is a p-channel TFT. The portion of the driver TFT 2, which is connected to a power supply line PL, is a source, while the portion thereof which is connected to the anode of the organic EL element 4 is a drain. The gate electrode of the driver TFT 2 is formed so as to cover the portion of the semiconductor layer, located between the source and drain, where no impurities are doped.

As described above, when the driver TFT 2 is shaped like an L or inverted L, at least a portion of the gate electrode 2g can be placed below the power supply line PL. That is, through utilization of the space below the power supply line PL, the aperture ratio can be increased.

Further, as the contact with the organic EL element 4 (an area in the vicinity of the area with reference numeral 2s in the drawing) is located in the center portion of each pixel region, the gate electrode 2g can be formed straight. This can prevent reduction of the aperture ratio due to a gate electrode 2g detouring around the contact.

Still further, as the respective pixel regions have a constant height in this embodiment, the gate line GL can be laid straight. Yet further, the power supply line PL and the data line DL also can be laid straight, even though the width of pixel regions varies, as the pixels are arranged in stripe.

Yet further, the shape of a light emitting region inside each pixel region is modified for efficient arrangement of itself. For example, in a G pixel with a wider pixel region, a holding capacitor 3 is arranged beside the selection TFT 1, leaving sufficient space for the light emitting region to extend upward (in the drawing) within the pixel region. In this manner, the pixel region is efficiently utilized.

All driver TFTs have the same size, and a structural relationship between a driver TFT and a concerned power supply line PL is identical for all pixels. That is, in all pixels, a contact between a driver TFT 2 and a power supply line PL and a contact between the driver TFT 2 and an organic EL element are identically positioned in the horizontal direction (in the drawing), as well as in view of the concerned power supply line PL. This arrangement can readily achieve constant current supply capacities of the respective driving TFTs 2.

It should be noted that, in FIG. 2, the transparent electrode part of the organic EL element 4 is indicated by a two-dot line and, simplify interpretation of the drawing, is shown in a smaller size.

Figure 3:
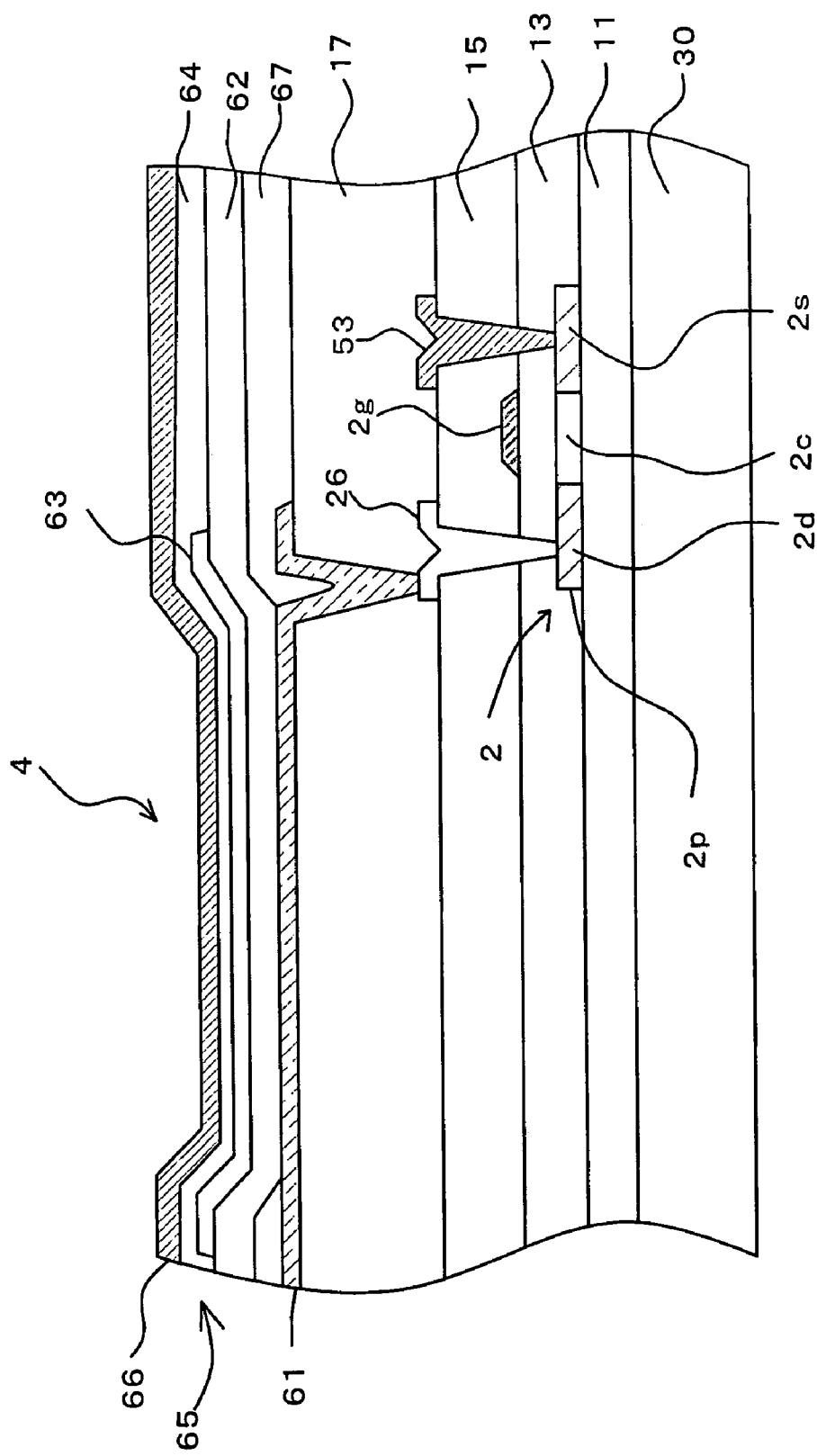
FIG. 3 is a cross sectional diagram showing essential portions in the embodiment.

FIG. 3 is a cross sectional view showing a structure of a light emitting region and a driver TFT of a single pixel along line X—X in FIG. 2, that is, along a line bending at a right angle along the L-shaped driver TFT 2.

As shown, a buffer layer 11 comprising SiN and $SiO_2$ laminated layers is formed over the entire surface of a glass substrate 30, and a poly-silicon semiconductor layer (an active layer) 2p is formed thereon in a predetermined area (an area for a TFT).

Further, covering the entire surface of the active layer 2p and the buffer layer 11, a gate insulating film 13 is formed. The gate insulating film 13 comprises, for example, $SiO_2$ and SiN laminated layers. On the gate insulating film 13 and in an area above the channel region 2c, a gate electrode 2g is formed using Cr, for example.

Then, using the gate electrode 2g as a mask, impurities are doped into the active layer 2p, whereby a channel region, where no impurities are doped, is formed in the middle of the active layer 20 below the gate electrode 2g, and source and drain regions 2s and 2d, where impurities are doped, are formed on both sides of the channel region 2c in the active layer 2p.

Further, covering the entire surface of the gate insulating film 13 and the gate electrode 2g, an interlayer insulating film 15 is formed. Then, contact holes are formed, piercing through the interlayer insulating film 15, above the source region 2s and the drain region 2d, respectively, and a source electrode 53 and a drain electrode 26 are formed on the surface of the interlayer insulating film 15 through the respective contact holes. The source electrode 53 is connected to a power supply line (not shown). The thus formed driving TFT may be either a p-channel TFT, as is in the above example, or an n-channel TFT.

Still further, a planarization film 17 is formed covering the entire surface of the interlayer insulating film 15. Then, a transparent electrode 61 is formed on the planarization film 17, for serving as an anode of the organic EL element 4. Another contact hole is formed above the drain electrode 26, piercing through the planarization film 17, and the drain electrode 26 is connected to the transparent electrode 61 through the contact hole.

It should be noted that the interlayer insulating film 15 and the planarization film 17 are generally made using an organic film such as acrylic resin, and may alternatively be made using an inorganic film, such as TEOS. The source electrode 53 and the drain electrode 26 are formed using metal such as aluminum, while the transparent electrode 61 is generally formed using an ITO.

Further, an organic layer 65, which comprises a hole transport layer 62, an organic light emitting layer 63, and an electron transport layer 64, is laid on the transparent electrode 61. The hole transport layer 62 and the electron transport layer 64 cover the entire surface of the pixels. The organic light emitting layer 63 is slightly larger than the light emitting region. Further, an opposing electrode 66, comprising metal, such as aluminum (AL), is formed over the entire surface of the pixels, to serve as a cathode.

In this structure, a planarization film 67 is formed surrounding the transparent electrode 61 and below the hole transport layer 62. The planarization film 67 defines a part of the hole transport layer 62, which is in direct contact with the transparent electrode 61, and the part constitutes a light emitting region for a concerned pixel.

It should be noted that the planarization film 67 is generally made using an organic film made of acrylic resin or the like, and may alternatively be made using an inorganic film, such as TEOS.

The hole transport layer 62, the organic light emitting layer 63, and the electron transport layer 64 are made using material which is generally used for an organic EL element. The color of emission light depends on the material used to form the organic light emitting layer 63, which is generally dopant. For example, NPB is used for the hole transport layer 62; TBADN+DCJTB is used for an organic light emitting layer 63 for red light; Alq3+CFDMQA is used for an organic light emitting layer 63 for green light; TBADN+NPB is used for an organic light emitting layer 63 for blue light; and Alq3 is used for the electron transport layer 64.

With the above-described structure, when the driver TFT 2 is turned on according to the voltage set in the gate electrode 2g, current is supplied from the power supply line via the transparent electrode 61 to the opposing electrode 66, and light emission according to the current is caused in the organic light emitting layer 63. The emitted light passes through the transparent electrode 61, the planarization film 17, the interlayer insulating film 15, the gate insulating film 13, and the glass substrate 30, to be emitted downward (in the drawing)

What is claimed is:

1. An organic EL panel, comprising:
   pixels arranged in a matrix, each pixel including an organic EL element having at least an organic light emitting layer between a pair of electrodes,
   wherein
   each pixel has a drive transistor for supplying a current from a power supply line to the organic EL element of the pixel,
   the drive transistor has a semiconductor layer having a substantially L shape,
   a source region and a drain region are formed at both ends of the semiconductor layer,
   a channel region is formed in a region between the source region and the drain region, the region including a corner of the substantially L shape,
   the channel region is covered by a gate electrode which extends straight along one edge of the semiconductor layer; and
   a portion of the semiconductor layer corresponding to the corner of the substantial L shape overlaps the gate electrode.

2. The organic EL panel according to claim 1, wherein the power supply line extends in a column direction, and the semiconductor layer comprises a first portion extending along the power supply line and a second portion bending at a substantially right angle.

3. The organic EL panel according to claim 2, wherein the gate electrode extends in a direction identical to a direction in which the first portion extends.

4. The organic EL panel according to claim 2, wherein a tip end of the first portion is connected to the power supply line, and the second portion is connected to the organic EL element.

5. The organic EL panel according to claim 4, wherein the power supply line has a projected portion projecting toward a side of the drive transistor, and the projected portion is connected to the first portion via a contact.

6. The organic EL panel according to claim 1, wherein the power supply line is placed between columns of the pixels and supplies power to the organic EL elements of the pixels in two columns arranged on both sides of the power supply line.

7. The organic EL panel according to claim 6, wherein light emitting colors of the pixels include R (red), G (green), B (blue), and W (white), pixels for emitting light of the same color are arranged in a column direction, one of the power supply lines is shared by pixels in a column for a light color with maximum current efficiency in light emission by the organic EL element and pixels in a column for a light color with minimum current efficiency, and another power supply line is shared by pixels in columns for other light colors.

8. The organic EL panel according to claim 7, wherein the one of the power supply lines is shared by pixels for W and G light and the other power supply line is shared by pixels for W and G light.

9. The organic EL panel according to claim 1, wherein each pixel has a holding capacitor for holding a gate voltage of the drive transistor, the holding capacitor is placed on a side of one end of each pixel in the column direction, the organic EL element is placed on a side of another end of the pixel in the column direction, the drive transistor is placed between the organic EL element and the power supply line, and the gate electrode is placed to partially overlap the power supply line.

10. The organic EL panel according to claim 9, wherein the power supply line has a projected portion projecting toward a side of the pixel, and the projected portion is connected to the drive transistor.

* * * * *